United States Patent [19]

Nott

[11] Patent Number: 4,627,102

[45] Date of Patent: Dec. 2, 1986

[54] SQUELCH CIRCUIT

[75] Inventor: Henry A. Nott, Maribrynong, Australia

[73] Assignee: The Commonwealth of Australia, Australia

[21] Appl. No.: 713,387

[22] PCT Filed: Jun. 21, 1984

[86] PCT No.: PCT/AU84/00112

§ 371 Date: Feb. 15, 1985

§ 102(e) Date: Feb. 15, 1985

[87] PCT Pub. No.: WO85/00256

PCT Pub. Date: Jan. 17, 1985

[30] Foreign Application Priority Data

Jun. 27, 1983 [AU] Australia .............. PG0003

[51] Int. Cl.⁴ .............................. H04B 1/10
[52] U.S. Cl. ................... 455/221; 455/212; 455/220; 381/94
[58] Field of Search .......... 455/212, 218, 221, 222, 455/220, 213; 328/165; 381/46, 94

[56] References Cited

U.S. PATENT DOCUMENTS

| | | | |
|---|---|---|---|
| 3,939,425 | 2/1976 | Toyoshima | 329/124 |
| 4,061,979 | 12/1977 | Walker et al. | 331/17 |
| 4,093,824 | 6/1978 | Grosjean | 455/222 |
| 4,117,410 | 9/1978 | Bender | 329/50 |
| 4,228,320 | 10/1980 | Celli et al. | 179/2 EA |
| 4,323,393 | 11/1980 | Kumaoka et al. | 455/154 |
| 4,342,120 | 7/1982 | Settlemire et al. | 455/222 |
| 4,355,417 | 10/1982 | Kozak, Jr. | 455/218 |
| 4,388,730 | 6/1983 | Nash et al. | 455/222 |
| 4,492,233 | 1/1985 | Petrofsky et al. | 128/421 |

FOREIGN PATENT DOCUMENTS 6196380 2/1980 Australia .............. 455/222

Primary Examiner—Marc E. Bookbinder
Assistant Examiner—Andrew J. Telesz, Jr.
Attorney, Agent, or Firm—Roylance, Abrams, Berdo & Goodman

[57] ABSTRACT

A squelch circuit in which a phase locked loop (PLL) (5) having a voltage controlled oscillator (VCO) (7) and a phase comparator (10) is used to detect the number of zero crossings, these being low for a speech signal and high for noise. The error voltage produced in the phase locked loop (5) is fed through a network (12) which ensures that the matching of the input signal to the oscillator is faster when the input frequency drops than when the input frequency rises. The input signal is clipped to enhance the frequency spectra of speech by using a limiting amplifier. The muting gate (2) output is derived from the VCO (7) control voltage of the PLL (5) to mute the output of the receiver when the VCO (7) output frequency is higher than a pre-set frequency for more than a pre-set time.

2 Claims, 1 Drawing Figure

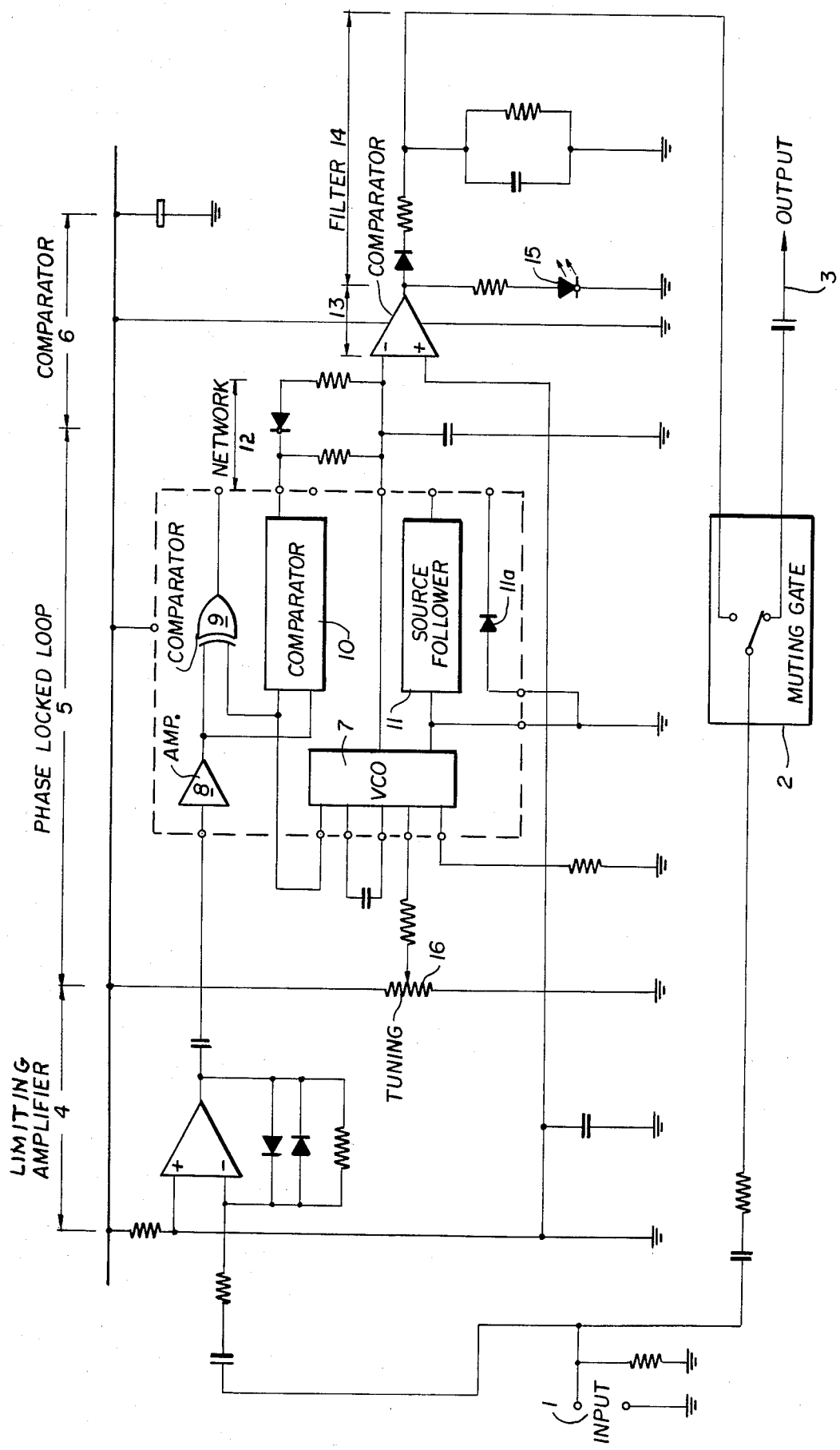

SQUELCH CIRCUIT

This invention relates to the processing of audio signals in relation to deriving a squelch function for use with radio receivers. The term 'squelch' refers to the muting of or significant reduction of the level of audio output of a receiver when there is no intelligence being received, thereby relieving the aural strain of an operator why may have to maintain a listening watch for long periods.

A variety of solutions to this requirement have been proposed. Australian Pat. Nos. 500,961 and 509,953 each deal with a squelch facility to reduce background noise by comparison of energy levels in the frequency range outside the audio range. Other techniques which have been used are:

1. Comparative assessment of energy levels present in narrow sub-bands of the received audio band;
2. Real-time analysis of the audio signal;
3. The use of coded preambles and postambles on the transmitted signal;
4. The use of a tone transmitted continuously with the signal; and
5. Real-time analysis of the zero-crossings present in the audio signal.

The technique described in the U.S. Pat. No. 3,939,425 takes its input from the intermediate frequency (IF) signal of the receiver, to derive the muting signal. It also demodulates the IF signal to recover the audio output for the receiver.

It appears, from the description, that the technique is applicable only to amplitude modulated (AM) signals. Thus, the technique requires access to a signal (the IF signal) which is not normally available as a receiver output, and is applicable only to AM signals.

The above approaches have varying degrees of complexity and perform their function with varying degrees of success. In contrast the technique which is the subject of this invention has the object of being simple to implement, while providing excellent performance, and uses as its input only the audio signal from the receiver, thus not requiring access to a receiver IF signal.

To this end the present invention provides a squelch circuit for muting audio output of a receiver except when a desired audio signal is received, comprising: an input terminal connected to a limiting amplifier and a muting gate; a phase locked loop which receives the limiting amplifier output and which contains an oscillator and a phase comparator for comparing the frequency of said oscillator and said limiting amplifier output to produce an error voltage which is fed back to control said oscillator through a network to enable the oscillator to match its frequency to that of the limiting amplifier output, the match occurring faster when the limiting amplifier output frequency drops than when the limiting amplifier output frequency rises; said muting gate being connected to the output of said phase locked loop to mute the output of the receiver when the limiting amplifier output frequency is higher than that desired.

The device of this invention performs an analysis of a receiver audio output in terms of the zero-crossings of the signal and provides an output signal which can be used to control the muting of the system.

Examination of the spectra of audio signals produced by a radio receiver shows that for speech, the frequency of the dominant spectral components lies in the range from about 100 Hz to 300 Hz for male voices and from about 200 Hz to 700 Hz for female voices. These figures hold true for the majority of english speech, the exception being with sibilants and fricatives. With noise, however, the frequency of the dominant spectral components covers a much wider range, limited by the bandwidth of the receiver.

Preferably the oscillator in the phase locked loop is a voltage controlled oscillator (V.C.O.). The muting gate output is preferably derived from the V.C.O. control voltage of the phase locked loop to mute the output of the receiver when the V.C.O. output frequency is higher than a pre-set frequency for more than a pre-set time.

A preferred embodiment of this invention will now be described with reference to the circuit diagram shown in the FIGURE.

The audio input is shown at 1 a muting gate at 2 and the output at 3.

The present embodiment uses a limiting amplifier 4 to process the audio signal, and uses a phase-locked loop (PLL) 5 to determine the average zero-crossing rate of the limited signal.

If the audio output from a receiver is passed through a limiting amplifier, thus removing all information that is not near the center of the waveform, the resultant spectrum has the dominant spectra enhanced, thus providing a low (100 to 700 Hz) average zero-crossing rate for speech and a higher (800 to 3000 Hz) average zero-crossing rate for noise. The PLL 5 attempts to track the average frequency of the clipped audio signal.

The PLL device contains a voltage-controlled oscillator (VCO) 7, an input amplifier 8, a type I phase comparator 9, a type II phase comparator 10, a source follower 11, and a zener diode 11a. The VCO signal from 7 is compared in frequency with the clipped audio signal by the phase comparator 10 and an error voltage derived. The type I phase comparator 9, the source follower 11 and the zener diode 11a all of which are components of this standard PLL component, are not used in this application of the invention.

The feedback provided by the error voltage generated by the phase comparator 10 attempts to maintain the VCO frequency equal to the instantaneous frequency of the clipped audio. Thus, the VCO control voltage corresponds to the average zero-crossing rate of the input signal. The error voltage is fed through a network 12 which provides fast attack when the input frequency drops, and a slower decay when the frequency rises.

Thus, when the average zero-crossing rate suddenly reduces, corresponding to the appearance of speech components on the receiver signal, the VCO frequency will quickly attempt to follow, rapidly lowering the VCO control voltage which is used to unmute the receiver. If the zero-crossing rate later increases, as would occur at the end of a transmission when the carrier ceases, the VCO frequency will rise slowly, and will only mute the receiver when it has risen above a specific threshold voltage. This fast attack and slow decay allows the muting to be held off between words of the speech, even though the zero-crossing rate is high during this time.

The VCO control voltage is fed to a comparator 13 to derive the muting signal. When the VCO control voltage is lower than the comparator reference (half the supply in this case) the muting signal is high. When the VCO control voltage is greater than the reference, the muting signal is low. The comparator signal is further smoothed and modified in its attack and decay characteristics by a non-linear filter 14 on the comparator output, and fed to a muting switch 2 in the form of an analogue gate for the control of the audio output signal. The output of the comparator is also fed to a light emitting diode 15 which gives visual indication that the VCO frequency is below the specified limit, corresponding to the detection of speech.

Since the spectral nature of speech and the noise output of a receiver both vary, an adjustment 16 is provided to set the optimum centre frequency and tuning range of the VCO. The adjustment of the frequency characteristics of the VCO is implemented in a manner somewhat different to that generally used, and provides an essentially constant ratio between the centre frequency and the tuning range of the VCO as the centre frequency is adjusted. It has been demonstrated in tests involving a wide range of speech and noise spectra that the constant ratio between centre frequency and tuning range has advantage over the usual characteristic of the VCO where this ratio increases significantly with centre frequency.

With strong signals, the centre frequency setting is not critical, but to detect speech in very poor signal/noise ratios, the optimum adjustment range is narrower.

Because of the finite response time of the signal processing, unmuting will occur slightly after speech is first received, resulting in the partial loss of the first syllable of speech. In this embodiment, the reaction time of the system is such that very little degradation results from the delay. However, should this degradation be unacceptable, it can be overcome by incorporating a suitable delay in the path between the audio input and the muting switch.

The claims defining the invention are as follows

I claim:

1. A squelch circuit for muting audio output of a receiver except when a desired audio signal is received, comprising: an input terminal connected to a limiting amplifier and a muting gate; a phase locked loop which receives the limiting amplifier output and which contains an oscillator and a phase comparator for comparing the frequency of said oscillator and said limiting amplifier output to produce an error voltage which is fed back to control said oscillator through a network to enable the oscillator to match its frequency to that of the limiting amplifier output, the match occurring faster when the limiting amplifier output frequency drops than when the limiting amplifier output frequency rises; said muting gate being coupled to an output of said network to mute the output of the receiver when the limiting amplifier output frequency is higher than that desired.

2. A squelch circuit as claimed in claim 1 in which the limiting amplifier enchances the dominant frequency spectra of speech.

* * * * *